United States Patent [19]

Meier et al.

[11] Patent Number: 4,963,300
[45] Date of Patent: Oct. 16, 1990

[54] PROCESS FOR THE PREPARATION OF LAMINATES

[75] Inventors: Kurt Meier, Binningen; Theobald Haug, Frenkendorf, both of Switzerland; Wolfgang Scharf, Grenzach-Wyhlen, Fed. Rep. of Germany

[73] Assignee: Ciba-Geigy Corporation, Ardsley, N.Y.

[21] Appl. No.: 279,747

[22] Filed: Dec. 5, 1988

[30] Foreign Application Priority Data

Dec. 15, 1987 [CH] Switzerland ............... 4881/87

[51] Int. Cl.$^5$ ............... B29C 43/02; B29C 43/20; B29C 43/30
[52] U.S. Cl. ............... 264/22; 264/258; 156/242; 522/81
[58] Field of Search ............... 264/22, 258; 156/273.3, 156/242; 522/81

[56] References Cited

U.S. PATENT DOCUMENTS

| | | | |
|---|---|---|---|
| 4,252,592 | 2/1981 | Green | 156/242 |
| 4,252,593 | 2/1981 | Green | 156/273.3 |
| 4,374,077 | 2/1983 | Kerfeld | 264/22 |
| 4,624,912 | 11/1986 | Zweifel et al. | 156/230 |
| 4,668,553 | 5/1987 | Barber | 264/22 |
| 4,707,431 | 11/1987 | Umehara | 264/22 |
| 4,729,938 | 3/1988 | Tajima | 264/22 |
| 4,776,992 | 10/1988 | Irving | 264/22 |
| 4,788,015 | 11/1988 | Sakai | 264/22 |

FOREIGN PATENT DOCUMENTS

| | | |
|---|---|---|
| 837966 | 6/1984 | South Africa . |
| 843733 | 1/1985 | South Africa . |
| 850973 | 9/1985 | South Africa . |

OTHER PUBLICATIONS

Derwent, Abst. of EP-A-94915.
Derwent Abst. of EP-A-152,377.
Derwent Abst. of EP-A-126,712.
P. Magnani, "Elektronic Production and Prueftechnik", Jun. 1981, pp. 377–382.

*Primary Examiner*—Jay H. Woo
*Assistant Examiner*—Jeremiah F. Durkin, II
*Attorney, Agent, or Firm*—Stephen V. O'Brien

[57] ABSTRACT

A process for the preparation of a laminate including the steps (i) preparation of a layer by bringing into contact a fibrous substrate with a curable mixture containing an epoxy resin having on average at least two 1,2-epoxide groups per molecule or a mixture of these epoxy resins and a compound of the formula I $$[R^1(Fe^{II}R^2)_a]^{ab\oplus} \quad ab.[X]^{\ominus} \qquad (I)$$

or a mixture of these compounds, in which a and b are independent of one another 1 or 2, $R^1$ is a $\pi$-arene, $R^2$ is a $\pi$-arene or an indenyl- or cyclopentadienyl anion, $X^-$ is an anion $[LQ_m]^-$ or an anion of a partly fluorinated or perfluorinated aliphatic or aromatic sulfonic acid, L is P, As or Sb, Q is fluorine or some of the Q substituents may also be hydroxyl groups, and m corresponds to a value which exceeds the valence of L by unity, (ii) preparation of a laminated sequence from at least two layered materials which are to be bonded together (iii) compression moulding of the said laminate sequence at elevated temperature.

11 Claims, No Drawings

PROCESS FOR THE PREPARATION OF LAMINATES

The invention relates to a process for the preparation of laminates, the products obtainable from said process and the use of particular curing agents for the preparation of laminates.

Cationically curable mixtures containing metallocene complex salts as initiators are disclosed in EP A 94,915.

Selected curing agent/accelerator combinations, for example the dicyanediamide/benzyldimethylamine combination, are generally used for the preparation of laminates based on epoxides.

The resin formulations must meet a range of requirements, some which are difficult to reconcile.

Thus, for example, the prepreg should have an adequate shelf life, while the resin matrix in the compression mould should have a fast cure. Moreover the viscosity of the resin matrix should fall, at the beginning of the compression moulding process, to allow gases contained within the material to be pressed to escape. However, the fall in viscosity should only be to the extent which ensures that only a small proportion of the resin flows out of the fibre matrix.

Generally in hitherto known processes the crosslinking reaction begins as early as the prepreg preparation stage, since the disclosed curing agent/accelerator combinations already enter into a certain chemical reaction with the epoxy resin. Thus in the compression moulding process pressure and temperature must be altered in accordance with the reaction mentioned, in order to obtain the desired viscosity profile in the resin matrix.

A process for the preparation of laminates has now been found in which the pressure and temperature profiles in the compression moulding step can be varied within wide limits and in which shorter compression moulding cycles may be used compared with conventional processes. Moreover this process surprisingly produces laminates with improved final properties, such as increased glass transition temperature of the resin matrix or lower solvent absorbency in the laminate.

In this process a resin/initiator combination having a long latent period is used, with which the processing conditions can be adjusted in such a way that practically no preliminary crosslinking occurs during the prepreg preparation stage.

The process is further based on the surprising finding, that the curing reaction begins quickly and is completed rapidly in the compression step. Low viscosities of the matrix resin can thus be used at the beginning of the compression moulding process and the process may be controlled in such a way that only a desired proportion of the resin flows out of the fibre matrix.

The present invention relates to a process for the preparation of a laminate comprising the steps (i) preparation of a layer by bringing into contact a fibrous substrate with a curable mixture containing an epoxy resin having on average at least two 1,2-epoxide groups per molecule or a mixture of these epoxy resins and a compound of the formula I

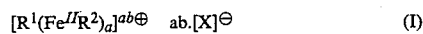

or a mixture of these compounds, in which a and b are independent of one another 1 or 2, $R^1$ is a $\pi$-arene, $R^2$ is $\pi$arene or an indenylor cyclopentadienyl anion, $X^-$ is an anion $[LQ_m]$—or an anion of a partly fluorinated or perflourinated aliphatic or aromatic sulfonic acid, L is P, As or Sb, Q is fluorine or some of the Q substituents may also be hydroxyl groups, and m corresponds to a value which exceeds the valence of L by unity, (ii) preparation of a laminated sequence from at least two layered materials which are to be bonded together, at least one of which is a layer which is obtainable according to step (i), in which the curable material is essentially present in its unaltered state, and (iii) compression moulding of the said laminate sequence at elevated temperature, in which pressure and temperature are selected in such a way that a liquid resin matrix is present at the beginning of this step, in which an initial fall in the viscosity is produced, so that entrained gases can virtually entirely escape from the laminate sequence, and that in the subsequent crosslinking reaction the rise in viscosity is carried out so quickly that the resin which flows out does not bind the compression mould.

In principle, all fibres which can form a bond with the epoxide matrix and produce a reinforcement of the matrix material are suitable as substrates.

Examples of fibre materials are natural polymers, such as cellulose; metals, such as steel, Ti, W, Ta or Mo; organic fibre-forming polymers, particularly aromatic polyamides, such as NOMEX or KEVLAR; carbon for example materials prepared by carbonizing cellulose, polyacrylo-nitrile or pitch; and particularly glass.

The fibre materials can be used as substrates in the most varied forms. They may be used for example in the form of continuous threads (individual-filaments or spun yarns), continuous filament yarns, or parallel rovings, as woven continuous filament yarns, spun rovings, roving fabrics, chopped fibres, continuous filament mats, chopped strand mats, webs, or felts (papers).

The bringing into contact of the fibrous substrate and the curable mixture will be different depending on the type of fibre and the shape of fibre or the properties of the matrix material. Examples of such processes are the impregnation of woven fabrics, non woven or continuous fibres with the liquid resin/initiator mixture or with a solution of a solid resin/initiator mixture in an inert solvent.

Layers containing chopped fibres can for example be prepared by spreading the curable mixture together with cut fibres on a fabric or a metal foil.

The bringing into contact of the fibrous substrate with the curable mixture is preferably carried out by impregnation. For this purpose webs of the said substrate are for example passed through a resin bath, containing epoxy resin, the initiator and, if appropriate, a solvent, are dried if desired, and subsequently wound up onto a storage spool.

It is recommended that the impregnated layers are subjected to a light exposure step before step (ii). The compound of formula I is thus converted into an activated form. This treatment enables the subsequent hot cure to be carried out at lower temperatures than would be required in the case of direct hot curing.

A process is thus preferred which comprises the steps (i), (ii) and (iii), defined above and in which an irradiation step (ia) is also incorporated prior to step ii), in which the compound of formula I is activated by exposure to actinic radiation.

In this case the prepreg obtained in step (i) may be irradiated or a fibrous substrate may be impregnated with a previously irradiated mixture of epoxy resin and initiator of the formula I.

The intensity and wavelength of the radiation to be used is dependent on the type of initiator; depending on the nature of the arene ligand $R^1$ the absorption of the initiator may vary within the UV range or within the visible range, for example in the 250–600 nm range.

Depending on the nature of the initiator, the curable mixture may additionally contain a sensitizer for the said initiator. Moreover the curable mixture may contain combinations of compounds of the formula I with oxidizing agents. These embodiments are described in EP A 152,377 and EP A 126,712. The descriptions of these publications are likewise a subject of the present description.

After impregnation and exposure to light, the material may advantageously be heated briefly, for example to 70°–120° C., in order to increase the viscosity of the resin, before step (ii) is carried out.

In step (ii) individual layers of the previously obtained material are laid on top of one another in the desired number. In this case the layers may all be of the same material or layers of other materials may also be present.

Examples of layers of other materials are metal foils, such as copper foils or aluminium foils, or other reinforcements, such as mats or non-wovens made from fibrous reinforcing material.

In step (iii) the arrangement arrived at according to step (ii) is cured by compression moulding and heating.

The process conditions in step (iii) may be held constant or varied. In an initial stage, for example, pressure and temperature can be applied in such a way that essentially no curing occurs or the speed of cure is so slow that the resin viscosity falls to the desired value as a result of the temperature increase. Subsequently pressure and/or temperature can be increased, so that the desired rate of increase in viscosity is attained. These increases can be carried out continuously or in stages. The pressure can also, for example, be increased in stages in accordance with the increase in viscosity, while the temperature is continuously increased.

Pressure and temperature can also, however, be pre-set immediately at the beginning of step (iii), so that the crosslinking reaction begins virtually immediately. This procedure is recommended in the case of liquid matrix resins having low viscosity. Here in general the initial compression is sufficient to remove the entrained gases from the layered material. Generally in systems of this kind there is only a short drop in viscosity before the curing reaction brings about an increase in viscosity.

Step (iii) can be carried out discontinuously in multiple-daylight presses or continuously in twin belt presses.

In a preferred embodiment of the process steps (ii) and (iii) are carried out continuously. For this purpose, webs of the material obtainable according to step (i) if desired, together with webs of other materials in layered form to be bonded together, are, for example, fed simultaneously between heatable twin belt presses in the particular desired lamination sequence.

In this embodiment, step (i) can be carried out separately, by which the fibrous substrate is brought into contact with the curable mixture and the webs obtained are wound up on storage spools.

Step (i) can, however, also be carried out continuously together with steps (ii) and (iii), by which, for example, webs of the fibrous substrate are fed through a resin bath immediately before step (ii).

In the continuous procedure, particularly fast acting initiators of the formula I are preferably used. These are in particular compounds of the formula I in which $X^\ominus$ is $AsF_6$ and very particularly $SbF_6$.

In this embodiment, the webs of impregnated material are as a rule exposed to actinic radiation, particularly to UV/visible radiation, before being fed through the twin belt press.

This can be done before or immediately after impregnation or shortly before the actual contacting step.

The compaction pressures in step (iii) are generally 1–60 bar, preferably 20–50 bar: the curing temperatures are generally 50° to 250° C., preferably 80° to 200° C. The compression period, depending on the particular curable mixture, is generally 0.1 to 120 minutes.

Compaction pressures and temperatures are generally dependent on the particular curable mixture used. The reactivity and state of aggregation of the particular resin/curing agent mixture, for example, are significant in the selection of experimental parameters.

The conditions necessary in a particular case can be selected and optimized by an expert using the criteria given above.

Practically all epoxy resins are suitable for use as the epoxy resin with on average at least two 1,2-epoxide resin groups per molecule. Examples of these are:

(I) Polyglycidyl esters and poly-($\beta$-methylglycidyl) esters, which are derived from compounds having at least two carboxyl groups in the molecule and epichlorohydrin or glyceroldichlorohydrin or $\beta$-methylepichlorohydrin.

Aliphatic polycarboxylic acids can be used as compounds having at least two carboxyl groups in the molecule. Examples of these polycarboxylic acids are oxalic acid, succinic acid, glutaric acid, adipic acid, pimelic acid, suberic acid, azelaic acid, sebacic acid or dimerized or trimerized linoleic acid.

Cycloaliphatic polycarboxylic acids can however also be used, for example tetrahydrophthalic acid, 4-methyltetrahydrophthalic acid, hexahydrophthalic acid or 4-methylhexahydrophthalic acid.

Moreover, aromatic polycarboxylic acids can be used, for example, phthalic acid, isophthalic acid or terephthalic acid.

(II) Polyglycidyl ethers or poly-($\beta$-methylglycidyl) ethers which are derived from compounds having at least two free alcoholic hydroxyl groups and/or phenolic hydroxyl groups and a suitably substituted epichlorohydrin.

Examples of compounds having at least two alcoholic hydroxyl groups are acyclic alcohols, such as ethylene glycol, diethylene glycol and higher poly-(oxyethylene)glycols, propane-1,2-diol or poly-(oxypropylene)glycols, propane-1,3-diol, butane-1,4-diol, poly-(oxytetramethylene) glycols, pentane-1,5-diol, hexane-1,6-diol, hexane-2,4,6-triol, glycerol, 1,1,1trimethylolpropane, pentaerythritol, sorbitol and polyepichlorohydrins.

Ethers of this kind can also be derived from cycloaliphatic alcohols, such as from 1,3- or 1,4-dihydroxycyclohexane, bis-(4-hydroxycyclohexyl)-methane, 2,2-bis(4-hydroxycyclohexyl)-propane or 1,1,-bis-(hydroxymethyl)-cyclohex-3-ene.

The epoxide compounds can also be derived from mononuclear phenols, for example resorcinol or hydroquinone; or they are based on multinuclear phenols, for example on bis-(4-hydroxy-phenyl)-methane, 4,4'-dihydroxydiphenyl, bis-(4-hydroxyphenyl)-sulfone, 1,1,2,2-tetrakis-(4-hydroxyphenyl)-ethane, 2,2-bis-(4-hydroxyphenyl)-propane, 2,2-bis-(3,5-dibromo-4-hydroxyphenyl)-propane and on novolaks obtainable by a condensation reaction of aldehydes, for example formaldehyde, acetaldehyde, chloral or furfuraldedehyde, with phenols such as phenol, or with phenols which are substituted in the nucleus by chlorine atoms or $C_1$–$C_9$alkyl groups, for example 4-chlorophenol, 2-methylphenol or 4-tert-butylphenol, or obtainable by a condensation reaction with bisphenols, as described above.

These epoxy resins also include the higher molecular weight and higher melting epoxy resins which are obtainable by so-called advancement reaction, i.e. by reacting relatively low molecular weight and low melting or liquid epoxy resins with polyfunctional compounds. Starting materials for advancement reactions of this type are, for example, low molecular weight diglycidyl ethers based on bisphenol, such as based on bisphenol A, which are reacted with less than the equivalent amount of a bisphenol, such as bisphenol A or tetrabromobisphenol A, in a manner known per se to produce higher molecular weight compounds.

Reactions of this kind are known per se and are described, for example, in Kirk-Othmer "Encyclopedia of Chemical Technology", Volume 9, pp. 275–276 (J. Wiley & Sons, New York 1980).

(III) Poly-(S-glycidyl) compounds, particularly di-S-glycidyl derivatives, which are obtained from dithiols, for example ethane-1,2-dithiol or bis(4-mercaptomethylphenyl)ethers.

(IV) Cycloaliphatic epoxy resins, such as bis-(2,3-epoxycyclopentyl) ethers, 2,3-epoxycyclopentylglycidyl ethers or 1,2-bis-(2,3-epoxycyclopentyloxy)-ethane or 3,4-epoxycyclohexylmethyl-3',4'-epoxycyclohexanecarboxylate.

However, epoxy resins may also be used in which the 1,2-epoxide groups are bonded to different heteroatoms or functional groups; included in these compounds are for example the glycidyl ether-glycidyl salicylates.

If desired, a mixture of epoxy resins can be used in the curable mixtures.

In order to control the viscosity profile in stage (iii) it can be advantageous to use a modified epoxy resin in stage (i), so as to obtain a higher initial viscosity and a faster increase in viscosity during the compression moulding stage.

Thus the epoxy resin can, for example, be modified by partial reaction with an epoxide curing agent which is effective at elevated temperature, for example an anhydride curing agent; or the epoxy resin is combined with a small quantity of a polyphenol, particularly of a novolak.

The quantity of modifiers is selected in such a way that the viscosity of the resin to be modified is increased, which increase is however not so big, that the initial fall in viscosity of the epoxy resin in step (iii) is suppressed.

In this embodiment a polyglycidyl ether particularly a diglycidyl ether based on bisphenol, which may preferably be advanced if desired, is also partially reacted with a cyclic anhydride of a polycarboxylic acid, particularly with an anhydride of a cycloaliphatic dicarboxylic acid; in another preferred alternative embodiment a polyglycidyl ether, particularly a diglycidyl ether based on bisphenol, which may also be advanced if desired, is combined with a small quantity of a novolak, particularly of a phenol-formaldehyde-novolak or of a cresol-formaldehyde-novolak.

A $\pi$-arene $R^1$ or $R^2$ is generally a non-basic heterocyclic aromatic or particularly a carbocyclic aromatic radical, having one or more aromatic rings, and in the case of radicals with more than one aromatic ring, these may be uncondensed or condensed. These radicals may be unsubstituted or they may be substituted by non-basic radicals.

$\pi$-arene $R^1$ or $R^2$ may be, in particular carbocyclic aromatic hydrocarbons having 6 to 24 carbon atoms, particularly having 6 to 12 carbon atoms, or heterocyclic aromatic hydrocarbons having 4 to 11 carbon atoms and 1 to 2 O or S atoms, where, if desired, these groups may be monosubstituted or polysubstituted by identical or different monovalent radicals, such as halogen atoms, preferably chlorine or bromine atoms, or $C_1$–$C_8$-alkyl, $C_1$–$C_8$alkoxy or phenyl groups. Uncondensed, polynuclear $\pi$-arene groups may be bonded directly or via bridging groups, such as —$CH_2$—, —$C(CH_3)_2$—, —CH=CH—, —O—, —S—, —$SO_2$— or —CO—.

Here, the alkyl or alkoxy groups may be straight chain or branched. Examples of typical alkyl or alkoxy groups are methyl, ethyl, n-propyl, isopropyl, n-butyl, sec-butyl, tert-butyl, n-pentyl, n-hexyl and n-octyl, methoxy, ethoxy, n-propoxy, isopropoxy, n-butoxy, n-hexyloxy and n-octylox. Alkyl or alkoxy groups having 1 to 4 carbon atoms are preferred. Preferred the substituted $\pi$-arenes are those which contain one or two of the above substituents, particularly methyl, ethyl, n-propyl, isopropyl, methoxy or ethoxy groups.

Moreover $R^2$ may be an indenyl anion and particularly a cyclopentadienyl anion, where these anions also may if desired be monosubstituted or polysubstituted, particularly monosubstituted, by identical or different monovalent radicals such as $C_1$–$C_8$alkyl or $C_1$–$C_8$alkoxy groups. $R^2$ is preferably an unsubstituted indenyl anion and an unsubstituted cyclopentadienyl anion is particularly preferred.

Examples of suitable $\pi$arenes $R^1$ or $R^2$ are benzene, toluene, xylenes, ethylbenzene, cumene, methoxybenzene, ethoxybenzene, dimethoxybenzene, p-chlorotoluene, m-chlorotoluene, chlorobenzene, bromobenzene, dichlorobenzene, trimethylbenzene, trimethoxybenzene, naphthalene, 1,2-dihydronaphthalene, 1,2,3,4-tetrahydronaphthalene, methylnaphthalene, methoxynphthalene, ethoxynaphthalene, chloronaphthalene, bromonaphthalene, biphenyl, stilbene, indene, 4,4'-dimethylbiphenyl, fluorene, phenanthrene, athracene, 9,10-dihydroanthracene, triphenyl, pyrene, perylene, naphthacene, coronene, thiophene, chromene, xanthene, tioxanthene, benzofuran, benzothiophene, naphthothiophene, thianthrene, diphenylene oxide and diphenylene sulfide.

Examples of anions of substituted cyclopentadienes are the anions of methyl-, ethyl-, n-propyl- and n-butyl-cyclopentadiene or the anions of dimethylcyclopentadiene.

When a is 2, $R^2$ is preferably in each case the indenyl anion, or if desired the substituted indenyl anion, or particularly the cyclopentadienyl anion.

The parameter a is preferably 1. The parameter b is preferably 1.

$X\ominus$ is preferably an anion of the formula $[LQ_m]\ominus$.

Q is preferably fluorine.

L is preferable As or Sb and particularly Sb.

The anion $X\ominus$ may also be an anion of a partly fluorinated or perflourinated aliphatic or aromatic sulfonic acid.

Anions of perfluoroaliphatic or perfluoroaromatic organic sulfonic acids are preferably used.

Examples of these are anions of $C_1$–$C_8$perfluoroalkane-monosulfonic aids or of perfluorobenzene - or perfluorotoluene-monosulfonic acid, such as $CF_3SO_3^-$, $C_2F_5SO_3^-$, $C_2F_7SO_3^-$, $C_4F_9SO_3^-$, $C_6F_{13}SO_3^-$, $C_8F_{17}SO_3^-$, $C_6F_5SO_3^-$ and $CF_3\text{-}C_6F_4SO_3^-$.

All of these anions are exceptionally weak nucleophiles.

Preferred anions are $X^\ominus$ are $PF_6^-$, $AsF_6^-$, $SbF_6^-$ or $SbF_5(OH)^-$.

Of these anions, $AsF_6^-$ and $SbF_6^-$ are especially preferred. Initiators containing the anions just mentioned, in particular containing the $SbF_6^-$anion, produce particularly fast curing epoxy resin mixtures.

The compounds of the formula I can be prepared by analogy with processes known per se. The preparation of metallocene complexes of this type containing complex halide anions is described for example in EP A 94,915.

Deviating from the process described there, compounds of the formula I containing other anions may be prepared by introducing instead of an anion of a complex acid, an anion of the acid HX in a manner per se, in which case $X^\ominus$ is as defined further above.

A process is preferred in which the epoxy resin in step (i) is a diglycidyl ether based on bisphenol, particularly a brominated diglycidyl ether based on a bisphenol or a prepolymerized diglycidyl ether based on a biphenol.

A process is particularly preferred in which the epoxy resin in step (i) is a diglycidyl ether based on a bisphenol, particularly based on biphenol A, which may if desired be advanced, which is modified with a small quantity of a cyclic anhydride of a polycarboxylic acid, particularly of an anhydride of a cycloaliphatic dicarboxylic acid.

A process which is also particularly preferred, is that in which the epoxy resin in step (i) is a diglycidyl ether based on a bisphenol, particularly based on bisphenol A, which may if desired be advanced, and which is used together with a small quantity of a novolak, particularly of a cresol-formaldehyde-novolak or of a phenol-formaldehyde-novolak.

A process is further preferred, in which the initiator has the formula Ia

$$[R^3Fe^{II}R^4]^\oplus X'^\ominus, \quad \text{(Ia)}$$

in which $R^3$ is a stilbene radical or is a benzene or naphthalene radical having one or two $C_1$–$C_4$alkyl or $C_1$–$C_4$alkoxy substituents, particularly a cumene or a methylnaphthalene radical, $R^4$ is an unsubstituted cyclopentadienyl anion and $X'^\ominus$ is selected from the group comprising $AsF_6^-$ and $SbF_6^-$.

A process is particularly preferred, in which in step (iii), a compaction pressure of 20–50 bar is applied for 1–45 minutes at a temperature of 80° to 200° C., particularly in the range 100° to 200° C.

A process is very particularly preferred in which glass fabric or paper is used as the fibrous substrate in step (i).

As already described further above, the cured laminates prepared by this process have improved final properties in comparison with conventionally prepared products.

The invention therefore also relates to the laminates which can be obtained by means of the above process.

The invention also relates to the use of the compounds of the formula I, defined further above for preparing laminates, preferably based on epoxides.

The curable composition used in step (i) may also contain further additives. These can be additives with which the final properties of the cured laminates and/or the processing properties of the mixture are modified.

Examples of such additives are fillers or extenders, such as chalk, talc, kaolin, mica, gypsum, titanium dioxide, powdered quartz, aluminium oxide, cellulose, alumina, ground dolomite, wollastonite, kieselguhr having a large specific surface area (obtainable under the trade name Aerosil), alumina modified with long chain amines (obtainable under the name Bentone), powdered polyvinyl chloride, polyolefines or aminoplastics, and metal powders, such as copper, silver, aluminium or iron powder, flame retardants, such as antimony trioxide; colorants, such as pigments or dyes; light stabilizers to improve the UV-resistance of the finished laminate; release agents, in order for example to separate the individual layers prepared in step (i) at an intermediate stage, such as release films, film-forming paints or waxes; thixotropic agents, such as highly dispersed silic; reactive diluents, such as phenylglycidyl ether or cresyl glycidyl ether, butanediol diglycidyl ether or hexahydrophthalic acid diglycidyl ether; or inert diluents, for preparing, for example, impregnation solutions from highly viscous or solid epoxy resin mixtures, such as chlorinated aliphatic or aromatic hydrocarbons, e.g. methylene chloride, trichloroethane, tetrachloroethane, chlorobenzene, or such as aromatic hydrocarbons, such as toluene or xylene, or such as aliphatic ketones, such as acetone or methyl ethyl ketone.

The laminates which are obtainable according to the invention are particularly useful for preparing printed circuit boards and insulating materials.

The following examples illustrate the invention.

EXAMPLE 1

A solution is prepared from 500 g of brominated technical grade diglycidyl ether based on bisphenol A (epoxide content: 2.30 equivalents/kg; bromine content: 19.7% by weight), dissolved in methyl ethyl ketone, and 2.0 g ($\eta^6$-isopropylbenzene) ($\eta^5$-cyclopentadienyl)iron-(II) hexafluoroantimonate (abbreviated to "photoinitiator I"). The concentration of this photoinitiator is 0.5 percent by weight based on the slid epoxy resin in the solution.

Webs made from glass fabric (weight per unit area 200 g/m$_2$) are impregnated with this solution; the impregnated glass fabric is allowed to drain at room temperature for a few minutes, before it is freed from solvent in a vented oven at 150° C. for 5 minutes. The webs which have been freed from solvent are irradiated for 120 seconds using a 5,000 Watt high pressure mercury vapour lamp, the distance between the glass fabric and the lamp being about 40 cm. The fabric is then cut into pieces of 15×15 cm. 8 of these pieces at a time are processed together in a heatable press to a laminate; in doing this, initial conditions applied are a pressure of 40 bar operating for 15 minutes at 80° C. and subsequently a pressure of 40 bar operating for 10 minutes at 180° C. The glass transition temperature of the finished laminate is 153° C.

EXAMPLES 2-4

As described in Example 1, glass fabric-reinforced laminates are prepared from the epoxy resin according to Example 1 and photo-initiator I, the amount of which is given in percent by weight, based on solid epoxy resin, in Table 1. This table also contains information about the drying period and drying temperature, the exposure time, and the compression cycle used, and the glass transition temperature achieved.

EXAMPLE 5

As described in Example 1, a laminate is prepared from photoinitiator I and a brominated technical grade diglycidyl ether based on bisphenol A (epoxide content: 2.8 equivalents/kg; bromine content: 20.3% by weight) dissolved in methyl ethyl ketone. The amount of photoinitiator as percent by weight of the solvent-free resin, drying period and exposure time, compression moulding conditions and the glass transition temperature of the finished laminate are given in Table 1.

impregnated fabric is allowed to drain for about 5 minutes at room temperature, before it is freed from solvent in a vented oven at 150° C. over a period of 5 minutes. The solvent-free webs are cut into pieces 15×15 cm in size.

8 of these pieces at a time are placed together in a press and compression moulded to a laminate, initially at a pressure of 20 bar for 10 minutes at 130° C., and subsequently at a pressure of 50 bar for 20 minutes at a temperature of 150° C. The glass transition temperature of the laminate is 142° C.

EXAMPLE 8

12.0 g "photoinitiator II" are dissolved at room temperature in 588 g of liquid solvent-free epoxy resin according to Example 6. Webs of glass fabric (200 gm/$^2$ weight per unit area) are impregnated with this resin; the soaked fabric is allowed to drain for a few minutes, before it is cut into pieces of 15×15 cm. 8 of these pieces at a time are placed together in a press and compression moulded to a laminate; initially a pressure of 20

TABLE 1

| Example No. | Amount of photo-initiator I based on solid resin | Drying in vented oven | Exposure time | Compression cycle pressure: 40 bar | $T_g$ of laminate |
|---|---|---|---|---|---|
| 2 | 1.0 | 5 min-/150° C. | 60 sec. | 15'/90° 20'/170° | +153°C. |
| 3 | 1.0 | 5 min-/150° C. | 15 sec. | 15'/130° 5'/180° | +154° C. |
| 4 | 0.5 | 5 min-/150° C. | 30 sec. | 5'/130° 10'/180° | +150° C. |
| 5 | 1.0 | 5 min-/150° C. | 60 sec. | 15'/90° 20'/180° | +182° C. |

EXAMPLE 6

6.0 g "photoinitiator I" are dissolved in 594 g of liquid brominated solvent-free diglycidyl ether based on bisphenol A (epoxide content: 4.3 equivalents/kg; bromine content: 20.5% by weight) at room temperature. This resin is used to impregnate webs of glass fabric (200 g/m$^2$ weight per unit area), the soaked glass fabric is allowed to drain for a few minutes before it is irradiated with UV light for 120 seconds as described in Example 1. The soaked web is then cut into pieces of 15×15 cm; 8 of these pieces at a time are laid on top of one another, and processed in a heatable press to produce a laminated moulding, for which they are subjected to a pressure of 20-30 bar at 180° C. for 20 minutes. The glass transition temperature of the finished laminate is 170° C.

EXAMPLE 7

10.0 g ($\eta^6$-1-methylnaphthalene)($\eta^5$-cyclopentadienyl)iron(II) hexafluoro-antimonate (abbreviated to "photoinitiator II") are added to 612.5 g of the brominated epoxy resin according to Example 1. The concentration of this photoinitiator is 2 percent by weight based on solid epoxy resin. Webs of glass fabric (weight per unit area 200 g/m$^2$) are soaked in this solution, the bar is applied for 5 minutes at 150° C., and subsequently a pressure of 40 bar is applied for 10 minutes at 180° C. The glass transition temperature of the laminate thus obtain is 169° C.

EXAMPLE 9

A solution is prepared from 915 g of a mixture, dissolved in methyl ethyl ketone, of brominated technical grade diglycidyl ether based on bisphenol and a small quantity of the glycidyl ether of 1,1,2,2-tetrakis-(4-hydroxyphenyl)-ethane (epoxide content 2.34 equivalents/kg; bromine content 18.9%) and 3.2 g "photoinitiator I"; the concentration of this photoinitiator is 0.5 percent by weight based on solid epoxy resin in the solution. Glass fabric-reinforced laminates are prepared as described in Example 1. Drying period and exposure time, compression moulding cycle and glass transition temperature $T_g$ achieved are given in Table 2.

EXAMPLE 10

A solution is prepared from 900 g of a brominated technical grade diglycid ether based on bisphenol A (epoxide content 1.86 equivalents/kg; bromine content 22.1%), dissolved in methylethyl ketone, and 3.15 g "photoinitiator I"; the concentration of the initiator is 0.5 percent by weight, based on solid epoxy resin. Glass fibre-reinforced laminates are prepared from this solution as described in Example 1. Drying period and exposure time, compression moulding cycle and glass transition temperature achieved are given in Table 2.

EXAMPLE 11

A solution is prepared from 1,000 g of a brominated technical grade diglycidyl ether based on bisphenol A (epoxide content 2.55 equivalents/kg; bromine content 21.5%), which contains a small amount of a glycidylized novolak, dissolved in methylglycol and methyl ethyl ketone, and 7.5 g "photoinitiator I"; the concentration of the latter is 1.0% based on solid resin in the solution. A glass fibre-reinforced laminate is prepared from this solution as described in Example 1; drying period and exposure time, compression moulding cycle and glass transition temperature are given in Table 2.

EXAMPLE 12

A solution is prepared comprising 800 g of a brominated technical grade diglycidyl ether based on bisphenol A (epoxide equivalent 1.88 equivalents/kg; bromine content 19.5%), dissolved in methyl ethyl ketone, and a small quantity of a phenolic novolak and 3.2 g "photoinitiator I"; the concentration of the latter is 0.50% based on solid resin in the solution. A glass fibre-reinforced laminate is prepared from this solution as described in Example 1. Drying period and exposure time, compression moulding cycle and glass transition temperature are given in Table 2.

EXAMPLE 13

A solution is prepared from 800 g of a brominated technical grade diglycidyl ether based on bisphenol A and tetrahydrophthalic anhydride (epoxide equivalent 1.83 equivalents/kg; bromine content 19.4%), dissolved in methyl ethyl ketone, and 3.2 g "photoinitiator I"; the concentration of the latter is 0.5% based on solid resin in the solution. A glass fibre-reinforced laminate is produced from this solution as described in Example 1. Drying period and exposure time, compression moulding cycle and glass transition temperature are given in Table 2.

EXAMPLE 14

A solution is prepared from 800 9 of a brominated technical grade diglycidyl ether based on bisphenol A and hexahydrophthalic anhydride (epoxide equivalent 1.83 equivalents/kg; bromine content 19.5%), dissolved in methyl ethyl ketone, and 3.2 g "photoinitiator I"; the concentration of the latter is 0.5% based on solid resin in the solution. A glass fibre-reinforced laminate is compression moulded using this solution as described in Example 1. Drying period and exposure time, compression moulding cycle and glass transition temperature are given in Table 2.

EXAMPLE 15

1.0 g "photoinitiator I" are dissolved in 400 g of liquid, solvent-free 3,4-epoxycyclohexylmethyl-3',4'-epoxycyclohexane carboxylate. Webs of glass fabric (200 g/m² weight per unit area) are impregnated with this resin and the glass fabric is allowed to drain for a few minutes before it is irradiated for 15 seconds with UV light. Subsequently 8 pieces, about 15×15 cm in size, at a time of the soaked fabric are laid one on top of another and processed in a heatable press at a pressure of 20–30 Kp/cm² for 15 minutes at 170° C. to give a laminate, which has a glass transition temperature of 135° C.

EXAMPLE 16

Using the solution mentioned in Example 10, webs of glass fabric impregnated and dried as described in Example 1. The impregnated webs are passed under a UV lamp (Fusion-D-lamps, 120 W/cm) at a speed of 7 m/minute. Subsequently the exposed prepregs are cut up and compression moulded as in Example 1. Drying period and exposure time, compression moulding cycle and glass transition temperature $T_g$ achieved are given in Table 2.

EXAMPLE 17

A solution is prepared from 375 g of the epoxy resin mentioned in Example 1 and 0.75 g "photoinitiator I" and 3.0 g ($\eta^6$-stilbene) ($\eta^5$-cyclopentadienyl)iron(II) hexafluorophosphate, i.e. 0.25% and 1.0% based on solid resin in the solution. Glass fabric-reinforced lainates are prepared as described in Example 1. Drying period and exposure time, compression moulding cycle and glass transition temperature $T_g$ achieved are given in Table 2.

EXAMPLE 18

A solution is prepared from 563 g of the epoxy resin mentioned in Example 1 and 2.25 g ($\eta^6$-stilbene)($\eta^5$-cyclopentadienyl)-iron(II) hexafluoro-antimonate; the concentration of the initiator is 0.5% based on solid epoxy resin. This solution is used to prepare a glass fibre-reinforced laminate as described in Example 1, and the drying period and exposure time and the compression moulding conditions and glass transition temperature are given in Table 2.

TABLE 2

| Example No. | Drying in the vented oven | Exposure (sec.) | Compression moulding cycle* | | Tg (°C.) |
|---|---|---|---|---|---|
| | | | Time | Temperature | |
| 9 | 5 mins/140° C. | 30 | 15' / | 170° C. | 150 |
| 10 | 5 mins/140° C. | 60 | 10' / | 180° C. | 143 |
| 11 | 5 mins/150° C. | 120 | 15' +20' / | 100° C. 180° C. | 153 |
| 12 | 5 mins/170° C. | 30 | 10' / | 180° C. | 144 |
| 13 | 2 mins/190° C. | 30 | 3' / | 200° C. | 139 |
| 14 | 5 mins/150° C. | 30 | 3' / | 200° C. | 141 |
| 16 | 5 mins/140° C. | — | 10' / | 170° C. | 142 |
| 17 | 2 min/190° C. | 30 | 15' / | 180° C. | 139 |
| 18 | 5 mins/150° C. | 30 | 15' / | 170° C. | 144 |

*Pressure: 20–30 (bar)

We claim:

1. A process for the preparation of a laminate comprising
   (i) preparing a layer by contacting a fibrous substrate with a curable mixture essentialy of at least one epoxy resin having an average at least two 1,2-epoxide molecule and, as initiator, at least one compound of formula I $$[R^1(Fe^{II}R^2)_a]^{ab\oplus} \quad ab.[X]^\ominus \quad (I)$$

in which a and b are independently of one another 1 or 2, $R^1$ is a carboxylic aromatic hydrocarbon having 6-24 carbons atoms which is unsubstituted or substituted one or more times with halogen, $C_1$-$C_8$alkyl, $C_1$-$C_8$alkoxy or phenyl; or $R^1$ is a heterocyclic aromatic hydrocarbon having 4–11 carbon atoms and 1 to 2 O or S atoms unsubstituted or substituted one or more times with halogen, $C_1$-$C_8$alkyl, $C_1$-$C_8$alkoxy or phenyl; $R^2$ is a carbocylic aromatic hydrocarbon having 6–24 carbons atoms which is unsubstituted or substituted one or more times with halogen, $C_1$-$C_8$alkyl, $C_1$-$C_8$alkoxy or phenyl; or $R^2$ is a heterocyclic aromatic hydrocarbon having 4–11 carbon atoms and 1 to 2 O or S atoms unsubstituted or substituted one or more times with halogen, $C_1$-$C_8$alkyl, $C_1$-$C_8$alkoxy or phenyl; or $R^2$ is an indenyl or a cyclopentadienyl anion unsubstituted or substituted with $C_1$-$C_8$alkyl or $C_1$-$C_8$alkoxy; $X^-$ is an anion of a partly fluorinated or perfluorinated aliphatic or aromatic sulfonic acid or an anion $[LQ_m]$ wherein L is P, As or Sb, and Q is fluorine or a mixture of fluorine and hydroxyl, m corresponds to a value which exceeds the valence of L by one;

(ii) preparing a laminated sequence from at least two layered materials which are to be bonded together, at least one of which is a layer according to step (i) wherein practically no preliminary crosslinking occurs;

(iii) placing the laminated sequence in a compression mold;

(iv) compression molding of the laminated sequence wherein pressure and temperature are selected in such a way that a liquid matrix is present at the beginning of this step in which an initial fall in viscosity is produced so that entrained gases can escape from the laminated sequence; and (v) executing the crosslinking reaction such that the rise in viscosity is carried out so quickly that the resin which flows out does not bind the compression mold.

2. A process according to claim 1, wherein an irradiation step (ia) is incorporated before step (ii), in which the compound of the formula I is exposed to actinic irradiation for activation.

3. A process according to claim 1, wherein steps (ii) and (iv) are carried out continuously.

4. A process according to claim 1, wherein the epoxy resin in step (i) is a diglycidyl ether based on a bisphenol.

5. A process according to claim 1, wherein the initiator has the formula Ia $$[R^3Fe^{II}R^4]^{\oplus}X'^{\ominus} \qquad (Ia)$$

in which $R^3$ is a stilbene radical or is a benzene or naphthalene radical having one or two $C_1$-$C_4$alkyl or $C_1$-$C_4$alkoxy substituents, $R^4$ is an unsubstituted cyclopentadienyl anion and $X'^{\ominus}$ is selected from the group consisting of $AsF_6^-$ and $SbF_6^-$.

6. A process according to claim 1, wherein, in step (iv), a compaction pressure of 20 to 50 bar is applied for 1–45 minutes at a temperature of 80° to 200° C.

7. A process according to claim 1, wherein the fibrous substrate of step (i) is glass fabric or paper.

8. A process according to claim 1, wherein the epoxy resin is a diglycidyl ether based on bisphenol which is modified with a cyclic anhydride of a polycarboxylic acid or a high molecular weight product made by reacting a diglycidyl ether based on bisphenol with less than an equivalent amount of a bisphenol which is modified with a cyclic anhydride of a polycarboxylic acid.

9. A process according to claim 8, herein the bisphenol is bisphenol A and the cyclic anhydride of a polycarboxylic acid is an anhydride of a cycloaliphatic dicarboxylic acid.

10. A process according to claim 8 further comprising a novolac.

11. A process according to claim 9 further comprising a compound selected from the group consisting of a cresol-formaldehyde-novolac and a phenol-formaldehyde-novolac.

* * * * *